(12) United States Patent
Tu et al.

(10) Patent No.: US 11,837,502 B2
(45) Date of Patent: Dec. 5, 2023

(54) SEMICONDUCTOR PACKAGE AND METHODS OF FORMING THE SAME

(71) Applicant: Taiwan Semiconductor Manufacturing Co., Ltd., Hsinchu (TW)

(72) Inventors: Meng-Che Tu, Hsinchu (TW); Wei-Chih Chen, Taipei (TW); Sih-Hao Liao, New Taipei (TW); Yu-Hsiang Hu, Hsinchu (TW); Hung-Jui Kuo, Hsinchu (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 180 days.

(21) Appl. No.: 17/341,015

(22) Filed: Jun. 7, 2021

(65) Prior Publication Data

US 2021/0296270 A1 Sep. 23, 2021

Related U.S. Application Data

(62) Division of application No. 16/399,710, filed on Apr. 30, 2019, now Pat. No. 11,031,289.

(Continued)

(51) Int. Cl.
*H01L 23/31* (2006.01)
*H01L 21/82* (2006.01)

(Continued)

(52) U.S. Cl.
CPC ............ *H01L 21/82* (2013.01); *H01L 21/565* (2013.01); *H01L 23/3107* (2013.01);

(Continued)

(58) Field of Classification Search
CPC ...... H01L 23/3107; H01L 24/08; H01L 21/82
See application file for complete search history.

(56) References Cited

U.S. PATENT DOCUMENTS

| 6,284,561 B1 | 9/2001 | Hung |
| 7,719,000 B2 | 5/2010 | Jeong et al. |

(Continued)

FOREIGN PATENT DOCUMENTS

| CN | 103187388 A | 7/2013 |
| CN | 104681485 A | 6/2015 |

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

A method of forming a semiconductor device includes forming a first dielectric layer over a front side of a wafer, the wafer having a plurality of dies at the front side of the wafer, the first dielectric layer having a first shrinkage ratio smaller than a first pre-determined threshold; curing the first dielectric layer at a first temperature, where after curing the first dielectric layer, a first distance between a highest point of an upper surface of the first dielectric layer and a lowest point of the upper surface of the first dielectric layer is smaller than a second pre-determined threshold; thinning the wafer from a backside of the wafer; and performing a dicing process to separate the plurality of dies into individual dies.

20 Claims, 17 Drawing Sheets

Related U.S. Application Data

(60) Provisional application No. 62/753,527, filed on Oct. 31, 2018.

(51) Int. Cl.
*H01L 23/00* (2006.01)
*H01L 21/56* (2006.01)

(52) U.S. Cl.
CPC .............. *H01L 24/08* (2013.01); *H01L 24/17* (2013.01); *H01L 2224/02372* (2013.01)

(56) References Cited

U.S. PATENT DOCUMENTS

| | | | |
|---|---|---|---|
| 7,790,503 B2 | 9/2010 | Lin et al. | |
| 8,755,880 B2 | 6/2014 | Higuchi et al. | |
| 8,772,178 B2 | 7/2014 | Ruelke et al. | |
| 8,841,411 B2 | 9/2014 | Kawano et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,240,551 B2 | 1/2016 | Hayoz et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,505,877 B2 | 11/2016 | Welker et al. | |
| 9,646,955 B2 | 5/2017 | Yu et al. | |
| 9,824,989 B2 | 11/2017 | Shih et al. | |
| 9,978,657 B2 | 5/2018 | Liu et al. | |
| 10,090,194 B2 | 10/2018 | Liu et al. | |
| 10,304,700 B2 | 5/2019 | Liu et al. | |
| 10,529,671 B2 | 1/2020 | Lee et al. | |
| 11,031,342 B2 * | 6/2021 | Tseng .................... | H01L 24/14 |
| 2004/0014317 A1 * | 1/2004 | Sakamoto ......... | H01L 23/49838 438/689 |
| 2008/0169123 A1 | 7/2008 | Sakamoto et al. | |
| 2014/0225222 A1 * | 8/2014 | Yu ....................... | H01L 27/1255 257/532 |
| 2014/0319683 A1 | 10/2014 | Lin et al. | |
| 2014/0357898 A1 | 12/2014 | Kawano et al. | |

FOREIGN PATENT DOCUMENTS

| | | |
|---|---|---|
| KR | 20030060898 A | 7/2003 |
| KR | 20150045375 A | 4/2015 |
| KR | 20150086170 A | 7/2015 |
| KR | 101730717 B1 | 4/2017 |
| TW | 200929407 A | 7/2009 |
| TW | 201715661 A | 5/2017 |
| TW | 201735106 A | 10/2017 |
| TW | 201834168 A | 9/2018 |

* cited by examiner

SEMICONDUCTOR PACKAGE AND METHODS OF FORMING THE SAME

PRIORITY CLAIM AND CROSS-REFERENCE

This application is a divisional of U.S. patent application Ser. No. 16/399,710, filed Apr. 30, 2019 and entitled "Semiconductor Package and Methods of Forming the Same," which claims priority to U.S. Provisional Patent Application No. 62/753,527, filed Oct. 31, 2018 and entitled "Semiconductor Package and Methods of Forming the Same," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

In an aspect of packaging technologies, redistribution layers (RDLs) may be formed over a chip and electrically connected to active devices in the chip. Input/output (I/O) connectors such as solder balls on under-bump metallurgy (UBMs) may then be formed to electrically connect to the chip through the RDLs. An advantageous feature of this packaging technology is the possibility of forming fan-out packages. Thus, the I/O pads on the chip can be redistributed to cover a greater area than the chip, and hence the number of I/O pads packed on the surfaces of the packaged chips can be increased.

Integrated Fan Out (InFO) package technology is becoming increasingly popular, particularly when combined with Wafer Level Packaging (WLP) technology. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
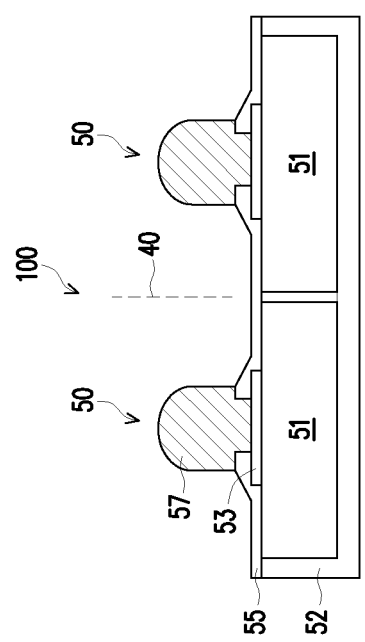
FIGS. 1-6 illustrate cross-sectional views of a semiconductor device at various stages of fabrication, in accordance with an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals in the various examples. Unless otherwise specified, same reference numerals refer to the same or similar components formed by the same or similar material(s) using the same or similar formation method(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the present disclosure are discussed in the context of forming semiconductor devices such as integrated fan-out (InFO) packages. The ideas of the disclosure may also be applied to other applications, such as wafer-level packaging (WLP) applications.

In some embodiments, a first dielectric layer is formed over a wafer comprising a plurality of dies. The first dielectric layer is formed over the passivation layer of the dies and over die connectors of the dies. The first dielectric layer has a high shrinkage ratio (e.g., 50%-80%) such that after being cured, the first dielectric layer has a non-flat (e.g., curved or wavy) upper surface, due to the different thicknesses of different portions (e.g., portions directly over the die connectors, and portions laterally adjacent to the die connectors) of the first dielectric layer. Next, a second dielectric layer, which has a low shrinkage ratio (e.g., smaller than 1%) is formed over the first dielectric layer and is cured. Due to the low shrinkage ratio, the upper surface of the second dielectric layer is substantially flat, e.g., with the different between a highest point of the upper surface of the second dielectric layer and a lowest point of the upper surface of the second dielectric layer being smaller than a pre-determined threshold (e.g., about 4 µm). The substantially flat upper surface of the second dielectric layer allows for a subsequent thinning process of the wafer to be performed evenly across the wafer surface. In another embodiment, a dielectric layer having a low shrinkage ratio (e.g., smaller than 1%) is formed directly over the passivation layer and is cured. Due to the low shrinkage ratio, the upper surface of the dielectric layer is substantially flat, e.g., with the different between a highest point of the upper surface of the dielectric layer and a lowest point of the upper surface of the dielectric layer being smaller than a pre-determined threshold (e.g., about 4 µm).

FIGS. 1-6 illustrates cross-sectional views of a semiconductor device 100 at various stages of fabrication, in accordance with an embodiment. Referring to FIG. 1, a plurality of dies 50 (also referred to as semiconductor dies, integrated circuit dies) are formed in a wafer 52. The dies 50 will be singulated in a subsequent processing step, e.g., by a dicing process performed along dicing lines 40 between adjacent dies 50, to form individual dies.

The integrated circuit dies 50 each includes a semiconductor substrate 51, such as silicon, doped or undoped, or an active layer of a semiconductor-on-insulator (SOI) substrate. The semiconductor substrate 51 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 51 and may be interconnected by interconnect structures formed by, for example, metallization patterns in one or more dielectric layers over the semiconductor substrate 51 to form an integrated circuit. For clarity, the devices (e.g., transistors or the like) and the metallization patterns are not individually illustrated.

The integrated circuit die 50 further comprises pads 53, such as aluminum pads, to which external connections are made. The pads 53 are on what may be referred to as respective front sides (may also be referred to as active sides) of the integrated circuit dies 50. A passivation layer 55 is formed at the front sides the integrated circuit dies 50 and on portions of the pads 53. Openings extend through the passivation layer 55 to the pads 53. Die connectors 57, such as conductive pillars (for example, comprising a metal such as copper), are in the openings through passivation layer 55 and are mechanically and electrically coupled to the respective pads 53. The die connectors 57 may be formed by, for example, plating, or the like. The die connectors 57 are electrically coupled to the respective integrated circuits of the integrate circuit dies 50.

Figure 2:
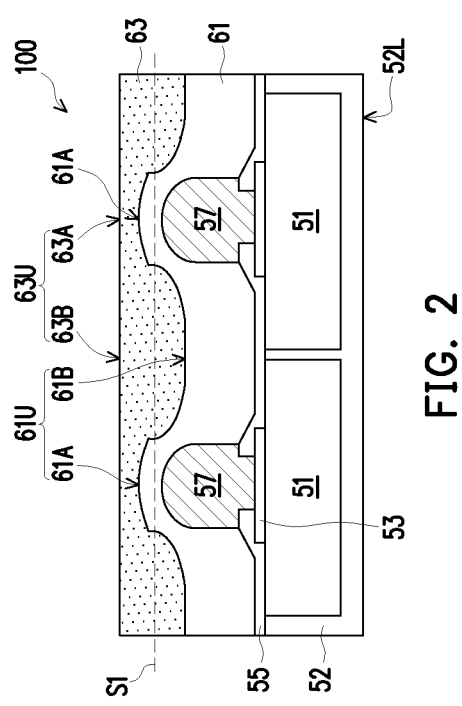

Next, in FIG. 2, a dielectric layer 61 is formed over the passivation layer 55 and over the die connectors 57. The dielectric layer 61 is a polymer layer, in the illustrated embodiment. The dielectric layer 61 may be formed by depositing a solution that comprises a solute (e.g., a polymer) dissolved in a solvent over the semiconductor device 100 of FIG. 1, where the polymer comprises polyimide (PI), polybenzoxazole (PBO), polyacrylate, the like, or combinations thereof, and the solvent comprises N-Methyl-2-pyrrolidone (NMP), gamma-butyrolactone (GBL), ethyl lactate (EL), tetrahydrofuran (THF), dimethylformamide (DMF), the like, or combinations thereof. A suitable deposition method, such as spin coating, may be used to deposit the dielectric layer 61. In some embodiments, a weight percent (wt %) the polymer in the solution is between about 20 wt % and about 40 wt %, and a weight percent of the solvent in the solution is between about 30 wt % and about 60 wt %. A shrinkage ratio of the deposited dielectric layer 61 (e.g., shrinkage due to a subsequent curing process) is between about 20% and about 50%, in an embodiment. The shrinkage ratio may be calculated by dividing the amount of shrinkage of the (cured) dielectric layer 61, e.g., shrinkage along a dimension such as a height of the dielectric layer 61, by the corresponding original dimension of the deposited dielectric layer 61. For example, if the dielectric layer 61 has a shrinkage ratio between about 20% and about 50%, then after curing, the dimension (e.g., thickness, or height) of the dielectric layer 61 may be between about 80% and about 50% of the original dimension (e.g., thickness, or height) of the dielectric layer 61 before the curing.

The solution comprising the polymer may include an initiator (e.g., a photo sensitizer) for the polymer. For example, for a positive tone polymer, the initiator may be or comprise dibenzoylmethanes; for a negative tone polymer, the initiator may be or comprise 2,2'-(Phenylimino)diethanol. In some embodiments, no initiator is used in the solution. The solution may further include a photo-crosslinker, e.g., for crosslink reaction. For example, the photo-crosslinker may be or include tetraethylene glycol dimethacrylate. In some embodiments, no photo-crosslinker is used in the solution.

In some embodiment, after the dielectric layer 61 is deposited over the passivation layer 55 and over the die connectors 57, an upper surface of the dielectric layer 61 (e.g., a solution at this stage of processing) distal to the substrate 51 is flat. A thickness of the dielectric layer 61, measured between the upper surface of the dielectric layer 61 and a lower surface of the dielectric layer contacting the passivation layer 55, may be, e.g., between about 25 µm and about 31 µm, such as 27 µm, although other dimensions are also possible, depending on factors such as the size (e.g., height) of the die connectors 57.

Next, a curing process is performed to cure the dielectric layer 61. The curing process may be performed at a temperature between about 170° C. and about 320° C., such as 320° C., for a duration of between about 1 hour and about 4 hours, such as 2 hours. Due to the large shrinkage ratio (e.g., between 50% and 80%) of the dielectric layer 61, and due to the differences in the thicknesses of different portions of the dielectric layer 61, the upper surface 61U of the dielectric layer 61 is a non-flat (e.g., uneven, non-planar, non-level, curved, or wavy) surface. For example, since a thickness of a first portion of dielectric layer 61 over (e.g., directly over) the die connectors 57 is smaller than a thickness of a second portion of the dielectric layer 61 between two die connectors 57 (e.g., directly over the passivation layer 55, or laterally adjacent to the die connectors 57), the first portion of the dielectric layer 61 shrinks less than the second portion of the dielectric layer 61 after the curing. As a result, after the curing process, the first portion of the dielectric layer 61 has an upper surface 61A, and the second portion of the dielectric layer 61 has an upper surface 61B, where the upper surface 61A extends further from the passivation layer 55 than the upper surface 61B. As illustrated in FIG. 2, the upper surface 61A is a convex upper surface, and the upper surface 61B is a concave upper surface. Alternating upper surfaces 61A and 61B form a wavy upper surface 61U for the dielectric layer 61.

In semiconductor manufacturing, a total thickness variation (TTV) may be used to characterize the variation of a thickness of a layer or a device. In the illustrated embodiment, the TTV of the dielectric layer 61 is determined by the unevenness of the upper surface 61U of the dielectric layer 61. In the illustrated embodiment, the TTV of the dielectric layer 61 may be calculated as a deviation by the upper surface 61U (e.g., 61A, 61B) from a plane S1, where the plane S1 is disposed mid-way between a highest point (e.g., a highest point of the upper surface 61A) and a lowest point (e.g., a lowest point of the upper surface 61B) of the upper surface 61U of the dielectric layer 61. In other words, a distance between the highest point and the lowest point of the upper surface 61U of the dielectric layer 61 is equal to twice the value of the TTV of the dielectric layer 61, in some embodiments.

In some embodiments, the TTV of the dielectric layer 61, after the curing process, is quite large (e.g., equal to or larger than about 11.5 µm) for advanced processing nodes. Such a large TTV, if left uncompensated, may cause problem for subsequent processing and may result in device failure, detail of which will be discussed hereinafter. To compensate for the large TTV of the dielectric layer 61, a dielectric layer 63 with a substantially flat upper surface (after curing) is formed over the dielectric layer 61, as discussed hereinafter.

Still referring to FIG. 2, after the dielectric layer 61 is cured, a solution comprising a polymer (a solute) dissolved in a solvent is deposited over the cured dielectric layer 61 to form the (uncured) dielectric layer 63, in some embodiments. In some embodiments, the polymer in the solution for forming the dielectric layer 63 comprises epoxy, phenolic epoxy, the like, or combinations thereof, and the solvent comprises N-Methyl-2-pyrrolidone (NMP), gamma-butyrolactone (GBL), ethyl lactate (EL), tetrahydrofuran (THF), dimethylformamide (DMF), the like, or combinations thereof. A suitable deposition method, such as spin coating, may be used to deposit the dielectric layer 63.

In some embodiments, a weight percent (wt %) the polymer in the solution is between about 20 wt % and about 40 wt %, and a weight percent of the solvent in the solution is between about 30 wt % and about 60 wt %. A shrinkage ratio of the deposited dielectric layer 63 (e.g., shrinkage due to a subsequent curing process) is between about 0% and about 5%. In an exemplary embodiment, the shrinkage ratio of the dielectric layer 63 is smaller than about 1% (e.g., between about 0.3% and 0.9%). The shrinkage ratio may be calculated by dividing the amount of shrinkage of the (cured) dielectric layer 63, e.g., shrinkage along a dimension such as a height of the dielectric layer 63, by the corresponding original dimension of the deposited dielectric layer 63. The disclosed shrinkage ratio may help to achieve a target TTV value (e.g., ±2 µm) for the dielectric layer 63 after curing. A larger shrink ratio may not achieve the target TTV value, while a smaller shrinkage ratio (e.g., smaller than about 0.3%) may need to use expensive material(s) with small shrinkage ratio for the dielectric layer 63, thus not economically feasible.

The solution for forming the dielectric layer 63 may include an initiator (e.g., a photo sensitizer) for the polymer. For example, for a positive tone polymer, the initiator may be or comprise dibenzoylmethanes; for a negative tone polymer, the initiator may be or comprise 2,2'-(Phenylimino)diethanol. In some embodiments, no initiator is used in the solution. The solution may further include a photo-crosslinker, e.g., for crosslink reaction. For example, the photo-crosslinker may be or include tetraethylene glycol dimethacrylate. In some embodiments, no photo-crosslinker is used in the solution.

In some embodiment, after the dielectric layer 63 is deposited over the dielectric layer 61, an upper surface of the dielectric layer 63 (e.g., a solution at this stage of processing) distal to the substrate 51 is flat. A thickness of the dielectric layer 63, measured between the upper surface 63U of the dielectric layer 63 and a lower surface of the dielectric layer 63 contacting the upper surface 61B of the dielectric layer 61, may be, e.g., between about 7 µm and about 15 µm, such as 9 µm, although other dimensions are also possible.

Next, a curing process is performed to cure the dielectric layer 63. In some embodiment, the curing process may be performed at a same temperature as the curing process for the dielectric layer 61, such as between about 170° C. and about 320° C. In some embodiments, the curing process for the dielectric layer 63 is performed at a temperature lower than the temperature of the curing process for the dielectric layer 61. For example, the curing process for the dielectric layer 61 may be performed at a temperature higher than about 300° C., such as 320° C., and the curing process for the dielectric layer 63 may be performed at a temperature lower than about 300° C., such as between about 200° C. and about 300° C. The curing process for the dielectric layer 63 may be performed for a duration between about 1 hour and about 4 hours, such as 2 hours.

Due to the small shrinkage ratio (e.g., smaller than 1%) of the dielectric layer 63, the upper surface 63U of the dielectric layer 63 remain substantially flat (e.g., level, even, planar) after the curing. In the example of FIG. 2, the upper surface 63U of the dielectric layer 63 include upper surfaces 63A and upper surfaces 63B that are disposed over (e.g., directly over) the upper surfaces 61A and 61B of the dielectric layer 61, respectively. A distances between the upper surface 63A and the upper surface 63B is smaller than a pre-determined threshold. In some embodiments, a TTV for a total thickness of the dielectric layers 63/61, determined by the upper surfaces 63A and 63B of the dielectric layer 63, is less than about ±2 µm. In other words, a maximum difference between a highest point (e.g., a highest point of the upper surface 63A) and a lowest point (e.g., a lowest point of the upper surface 63B) of the upper surface 63U is smaller than about 4 µm. Therefore, the dielectric layer 63 reduces the TTV of the total thickness of the dielectric layers 63/61, which in turn reduces or prevents InFO package device failure due to thickness variation among back-thinned dies, as discussed in detail hereinafter.

Figure 3:
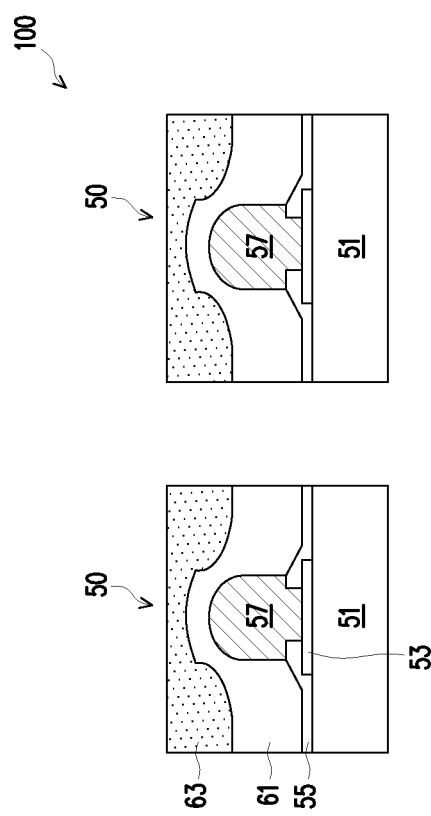

Next, in FIG. 3, a thinning process is performed from the lower side 52L (see FIG. 2) of the wafer 52, and thereafter, a dicing process is performed to separate the dies 50. The thinning process may be performed by a grinding process that removes portions of the wafer 52 and/or portions of the substrate 51 from the lower side of the wafer 52 (or the backside of the dies 50). After the thinning process, a dicing process, which may be performed using a dicing blade, a laser cutting tool, or the like, is performed to singulate the dies 50, thereby forming a plurality of individual dies 50. The dies 50 in FIG. 3 now include the dielectric layers 61 and 63.

The small TTV (e.g., smaller than about ±2 µm) of the dielectric layers 61/63 allows the thinning process to be performed evenly across the wafer 52, which results in the dies 50 having a substantially same thickness. For example, the thicknesses of the dies 50 are within ±2 µm from an average thickness of the dies 50. In other words, the TTV of the dies 50 is smaller than about ±2 µm, in the illustrated example.

Figure 4:
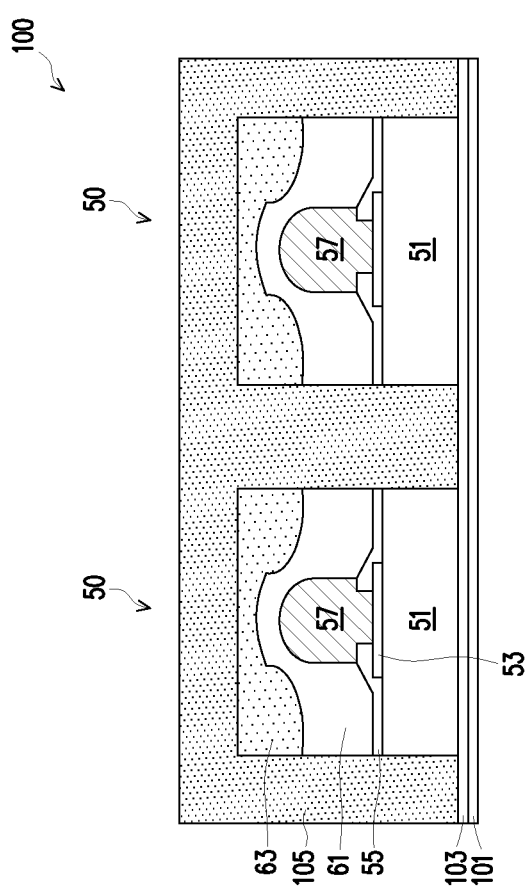

Referring next to FIG. 4, the dies 50 are attached to a carrier 101 by an adhesive layer 103, and a molding material 105 is formed over the carrier 101 and the adhesive layer 103 such that the molding material 105 surrounds the dies 50. A thickness of the deposited molding material 105 may be larger than the thickness of the dies 50, as illustrated in FIG. 4.

The carrier 101 may be made of a material such as silicon, polymer, polymer composite, metal foil, ceramic, glass, glass epoxy, beryllium oxide, tape, or other suitable material for structural support. The adhesive layer 103 is deposited or laminated over the carrier 101, in some embodiments. The adhesive layer 103 may be photosensitive and may be easily detached from the carrier 101 by shining, e.g., an ultra-violet (UV) light on the carrier 101 in a subsequent carrier de-bonding process. For example, the adhesive layer 103 may be a light-to-heat-conversion (LTHC) film.

The molding material 105 is then formed over the adhesive layer 103 to encapsulate the dies 50, as shown in FIG. 4. The molding material 105 may comprise an epoxy, an organic polymer, a polymer with or without a silica-based or glass filler added, or other materials, as examples. In some embodiments, the molding material 105 comprises a liquid molding compound (LMC) that is a gel type liquid when applied. The molding material 105 may also comprise a liquid or solid when applied. Alternatively, the molding material 105 may comprise other insulating and/or encapsulating materials. The molding material 105 is applied using a wafer level molding process in some embodiments. The molding material 105 may be molded using, for example, compressive molding, transfer molding, or other methods.

Next, the molding material 105 is cured using a curing process, in some embodiments. The curing process may comprise heating the molding material 105 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 105 may be cured using other methods. In some embodiments, a curing process is not included.

Figure 5:
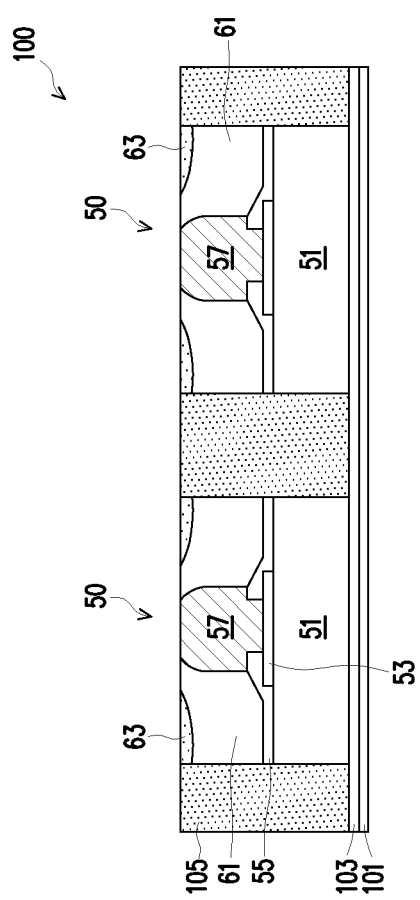

Next, in FIG. 5, a planarization process, such as a chemical and mechanical planarization (CMP) process, is performed to remove upper portions of the molding material 105 and to expose the die connectors 57 of the dies 50. The planarization process also removes portions of the dielectric layers 61/63. The planarization process may be controlled to stop once the die connectors 57 are exposed. The planarization process may remove a small top portion (e.g., a top portion with a thickness between about 6 μm and about 20 μm) of the die connectors 57.

After the planarization process, the molding material 105, the dielectric layers 61/63, and the die connectors 57 have a same level upper surface. Note that due to the non-flat (e.g., wavy) upper surface of the dielectric layer 61, portions of the dielectric layer 63 are left over certain regions (e.g., regions with concave upper surface) of the upper surface of the dielectric layer 61. In the illustrated example of FIG. 5, the dielectric layer 61 physically contacts and surrounds the die connectors 57, the dielectric layer 63 surrounds the die connectors 57 and is separated from the die connectors 57 by the dielectric layer 61. A thickness of the dielectric layer 63 after the planarization process may be less than about 2 μm, as an example. As illustrated in FIG. 5, the dielectric layer 63 has a curved lower surface and a flat upper surface. The dielectric layer 61 has a first portion (a portion contacting die connector 57) with a flat upper surface, and a second portion (a portion laterally adjacent to the die connector 57) with a curved (e.g., concave) upper surface.

Advantages of the presently disclosed methods may be appreciated by comparing a reference design where a dielectric layer(s) with larger TTV (e.g., the dielectric layer 61) is formed over the passivation layer 55 of the die 50 without forming the dielectric layer 63. The large TTV of the dielectric layer 61 would interfere with the thinning process and cause different portions of the wafer 52 to be thinned differently, thus resulting in the dies 50 having large differences in thickness (e.g., larger than ±11.5 μm from an average thickness of the dies 50). When the dies 50 with large difference in thickness are attached to the carrier 101, the upper surfaces of the die connectors 57 are at different level (e.g., at different height) from the carrier 101. As a result, after the planarization process, the die connectors 57 of dies 50 having larger thicknesses may be exposed, and the die connectors 57 of dies 50 having smaller thicknesses may still be covered by the dielectric layers 61/63, which may prevent the covered die connectors 57 from being electrically coupled to a redistribution structure (see 110 in FIG. 6) formed subsequently, thereby resulting in device failure due to incorrect electrically connection of the die connectors 57.

To partially compensate for the larger TTV of the reference design, a back grinding (BG) tape may be used to attach to the dielectric layer 61 of the reference design during the thinning process. The thickness and the flexibility (e.g., softness) of the BG tape may help reduce the impact of the large TTV of the dielectric layer 61 during the thinning process, but the dies 50 after the thinning process may still have a large TTV of about ±5 μm, which may still cause device failure and may lower production yield. In addition, the use of BG tape is expensive and incurs additional manufacturing cost. In contrast, the presently disclosed method, by forming the dielectric layer 63 with small TTV over the dielectric layer 61 with large TTV, effectively reduces the TTV of the dies 50, which in turn prevents or reduces the device failure as described above, and improves the yield of production and reduces the cost (e.g., by not using the BG tape) of manufacturing.

Figure 6:
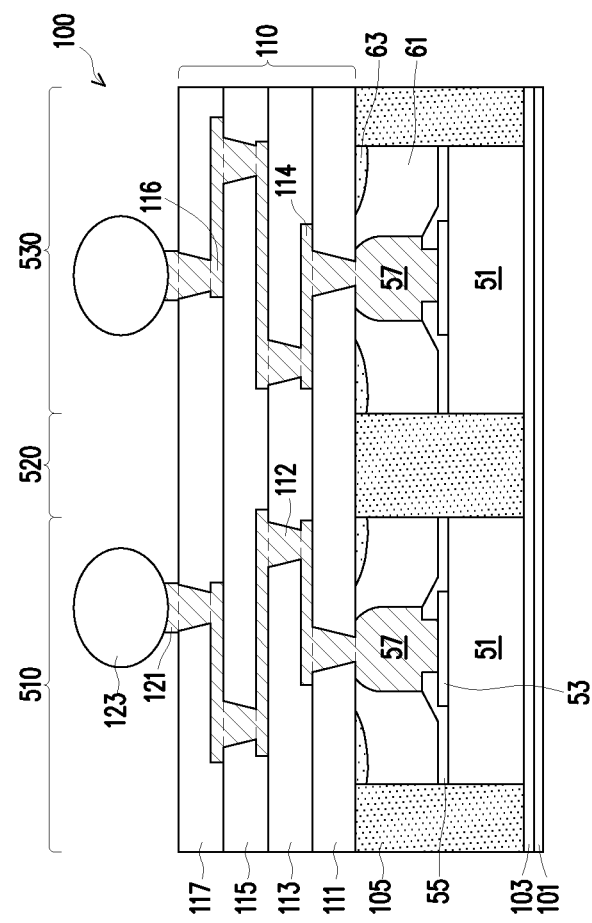

Referring next to FIG. 6, a redistribution structure 110 is formed over the molding material 105 and the dies 50, and is electrically coupled to the dies 50. After the redistribution structure 110 is formed, external connectors 123 are formed over and electrically coupled to the redistribution structure 110.

The redistribution structure 110 comprises conductive features such as one or more layers of conductive lines 114 and vias 112 formed in one or more dielectric layers 111/113/115/117. In some embodiments, the one or more dielectric layers 111/113/115/117 are formed of a polymer, such as polybenzoxazole (PBO), polyimide, benzocyclobutene (BCB), or the like. In other embodiments, the dielectric layers 111/113/115/117 are formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers 111/113/115/117 may be formed by any acceptable deposition process, such as spin coating, chemical vapor deposition (CVD), laminating, the like, or a combination thereof.

In some embodiments, the conductive features of the redistribution structure 110 comprise conductive lines 114 and/or vias 112 formed of a suitable conductive material such as copper, titanium, tungsten, aluminum, or the like. The conductive features may be formed by, e.g., forming openings in the dielectric layer (e.g., 111, 113, 115, or 117) to expose underlying conductive features, forming a seed layer over the dielectric layer and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed.

After the redistribution structure 110 is formed, external connectors 123 are formed over the redistribution structure 110. The external connectors 123 are electrically coupled to conductive features 116 (e.g., conductive pads in an upper-most metallization layer) of the redistribution structure 110, in some embodiments. In some embodiments, under-bump metallurgy (UBM) structures 121 are formed over and electrically coupled to the conductive features 116, and the external connectors 123 are then formed on the UBM structures 121. In some embodiments, the UBM structures 121 are not formed.

In an embodiment, the UBM structures 121 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 121. Any suitable materials or layers of material that may be used for the UBM structures 121 are fully intended to be included within the scope of the present disclosure.

The UBM structures 121 may be formed by: forming an opening in a top dielectric layer (e.g., 117) of the redistribution structure 110 to expose the conductive features 116; forming a seed layer over the top dielectric layer and along the interior of the opening in the top dielectric layer; forming a patterned mask layer (e.g., photoresist) over the seed layer; forming (e.g., by plating) the conductive material(s) in the openings of the patterned mask layer and over the seed layer; removing the mask layer and remove portions of the seed layer on which the conductive material(s) is not formed. Other methods for forming the UBM structures 121 are possible and are fully intended to be included within the scope of the present disclosure.

External connectors 123 are formed on the UBM structures 121. In an embodiment, the external connectors 123 are conductive bumps such as controlled collapse chip connection (C4) bumps and comprise a material such as tin, or other suitable materials, such as silver or copper. In an embodiment in which the external connectors 123 are tin solder bumps, the external connectors 123 may be formed by initially forming a layer of tin through any suitable method such as evaporation, electroplating, printing, solder transfer, ball placement, or the like. Once a layer of tin has been formed on the structure, a reflow is performed in order to shape the material into the bump shape.

However, while the external connectors 123 have been described above as C4 bumps, these are merely intended to be illustrative and are not intended to limit the embodiments. Rather, any suitable type of external contacts, such as ball grid arrays (BGAs), microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations of these, or the like, may alternatively be utilized. Any suitable external connector, and any suitable process for forming the external connectors, may be utilized for the external connectors 123, and all such external connectors are fully intended to be included within the scope of the embodiments.

In the example of FIG. 6, conductive features (e.g., conductive lines 114, vias 112) of the redistribution structure 110 are formed in regions 510 and 530 that are directly over the dies 50, and no conductive feature (e.g., conductive lines 114, vias 112) of the redistribution structure 110 is formed in the region 520, which region 520 is disposed laterally between adjacent dies 50 and serves as a dicing region in a subsequent dicing processing.

Additional processing may follow the processing of FIG. 6, as skilled artisans readily appreciate, thus details may not be discussed herein. For example, the structure of FIG. 6 may be flipped over, and the external connectors 123 may be attached to a dicing tape. The carrier 101 may then be removed by a carrier de-bonding processing, and a dicing process may be performed, e.g., to cut along the region 520, to form a plurality of individual semiconductor devices 100. In the illustrated embodiment, each of the individual semiconductor devices 100 may comprise a die 50, a redistribution structure 110, and external connectors 123 over the redistribution structure 110. The number of individual semiconductor devices 100, and the number of dies included in each individual device 100 as illustrated in FIG. 6 are merely non-limiting examples. Other numbers of semiconductor devices 100 and other numbers of dies 50 may be possible and are fully intended to be included within the scope of the present disclosure.

Figure 7:
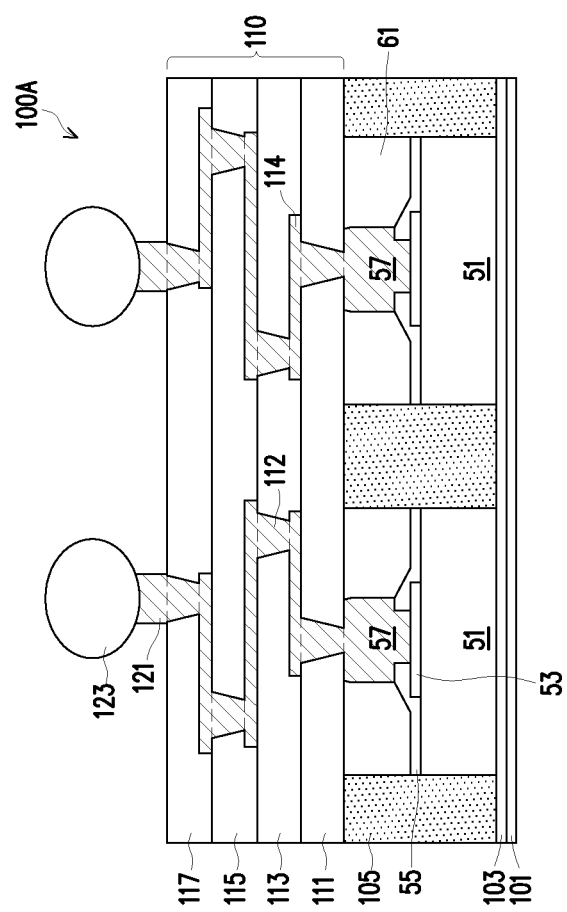
FIG. 7 illustrates a cross-sectional view of a semiconductor device, in accordance with an embodiment.

FIG. 7 illustrates a cross-sectional view of a semiconductor device 100A, in accordance with an embodiment. The semiconductor device 100A in FIG. 7 is similar to the semiconductor device 100 in FIG. 6 and may be formed by similar processing steps, but with the dielectric layer 63 of the dies 50 completely removed. In particular, during the planarization process (see, e.g., FIG. 5) to remove upper portions of the molding material 105, after the die connectors 57 are exposed, the planarization process continues until the dielectric layer 63 is completely removed. As illustrated in FIG. 7, the die connectors 57 and the dielectric layer 61 has a same level upper surface after the planarization process.

After the planarization process, the redistribution structure 110, the UBM structure 121 and the external connectors 123 are formed successively over the molding material 105 and over the dies 50 to form the structure shown in FIG. 7. Additional processing, such as attaching to a dicing tape, carrier de-bonding, and a dicing process may be performed to form a plurality of individual semiconductor devices 100A. Details are not repeated.

FIGS. 8-13 illustrates cross-sectional views of a semiconductor device 200 at various stages of fabrication, in accordance with an embodiment. In the discussion herein, unless otherwise specified, the same or similar numerals refer to the same or similar components that are formed using a same or similar material by a same or similar method, thus details may not be repeated.

Figure 8:
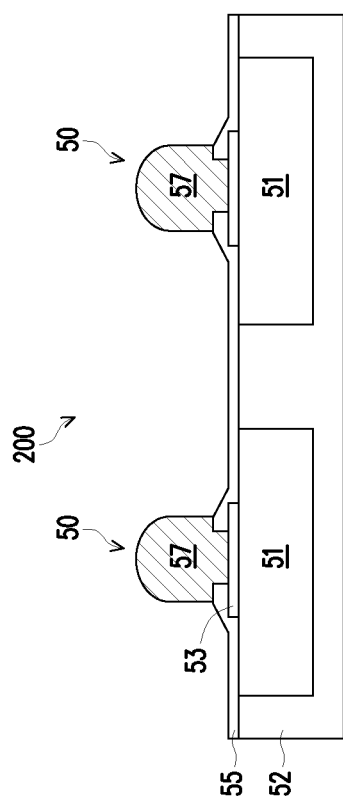
FIGS. 8-13 illustrates cross-sectional views of a semiconductor device at various stages of fabrication, in accordance with an embodiment.
Figure 9:
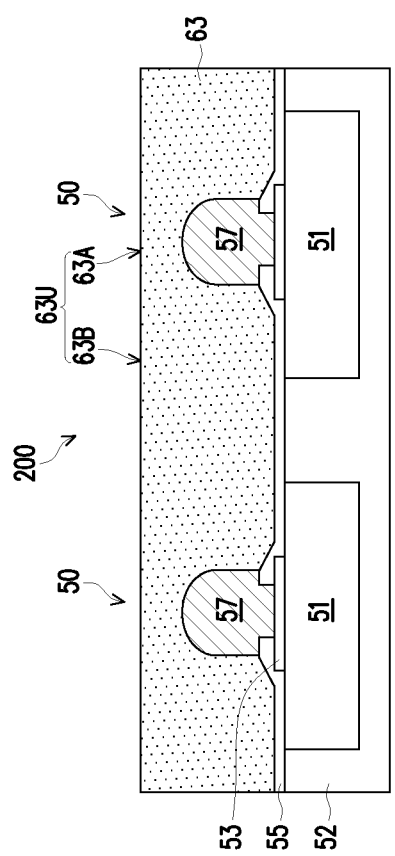

In FIG. 8, a plurality of dies 50 are formed in the wafer 52. Each of the dies 50 has die connectors 57 extending through the passivation layer 55. Next, in FIG. 9, the dielectric layer 63 is formed over (e.g., in direct contact with) the passivation layer 55 and over the die connectors 57. The dielectric layer 63 may be formed by depositing a solution comprising a polymer dissolved in a solvent over the passivation layer 55, then curing the deposited solution. Details of the composition of the dielectric layer 63 and formation method of the dielectric layer 63 are discussed above with reference to FIG. 2.

In some embodiments, the dielectric layer 63, after being deposited as a solution, has a thickness between about 25 µm and about 35 µm, such as 35 µm, although other dimensions are also possible. Next, a curing process may be performed for a duration between about 1 hour and about 4 hours, such as about 2 hours, to cure the deposited dielectric layer 63. Due to the small shrinkage ratio (e.g., smaller than about 1%) of the dielectric layer 63, the upper surface 63U of the dielectric layer 63 is substantially flat, with a TTV smaller than, e.g., ±2 µm. For example, a maximum distance between the upper surface 63A of the upper surface 63U over (e.g., directly over) a die connector 57 and the upper surface 63B of the upper surface 63U laterally adjacent to the die connector 57 (e.g., laterally between two die connectors 57) is smaller than about 4 μm. By forming the dielectric layer 63 with smaller TTV, the TTV of the dies 50 after the subsequent thinning process is also reduced, which prevents or reduces device failure due to incorrect electrical connection of the die connectors 57, as described above.

Figure 10:
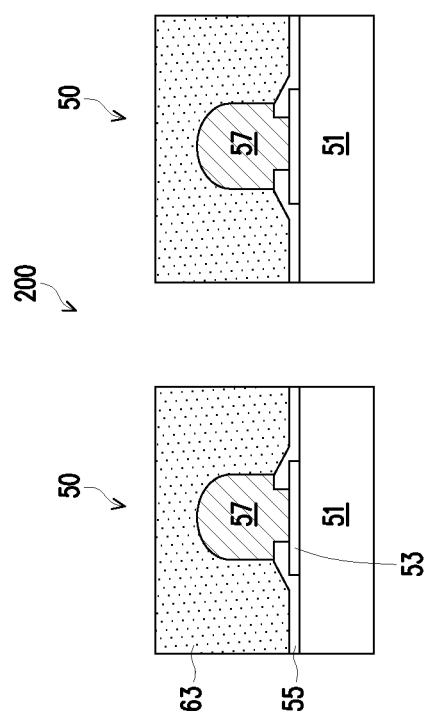
Figure 11:
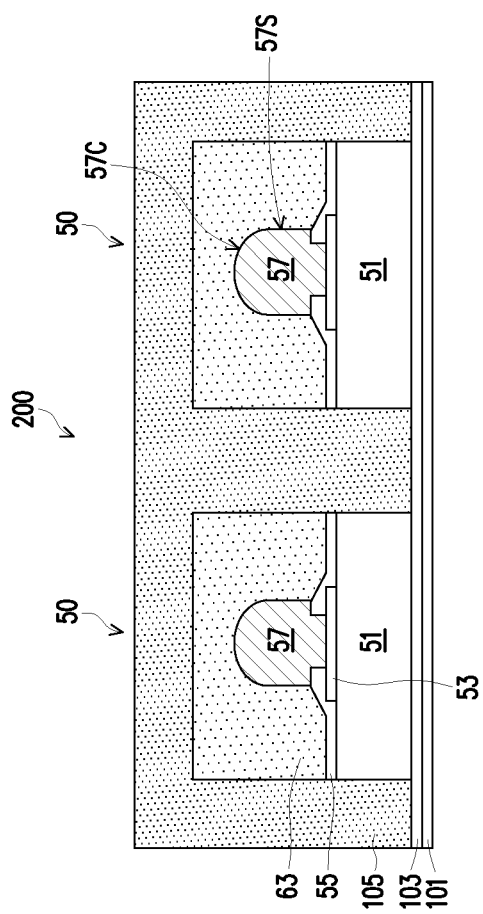

Next, in FIG. 10, the thinning process is performed at the backside of the wafer 52, and a dicing process is then performed to form individual dies 50. Next, in FIG. 11, the dies 50 are attached to the carrier 101 by the adhesive layer 103, and a molding material 105 is formed over the adhesive layer 103 and around the dies 50.

Figure 12:
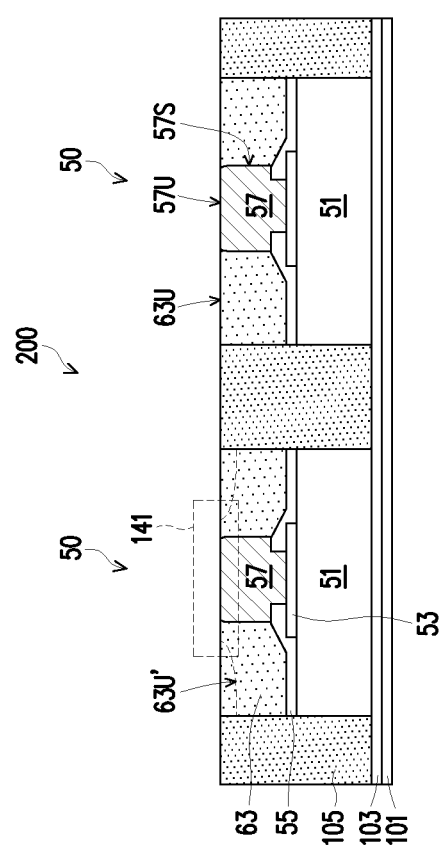

Next, in FIG. 12, a planarization process, such as CMP, is performed to recess the molding material 105 and to expose the die connectors 57. In the example of FIG. 12, after the planarization process, the die connectors 57, the dielectric layer 63, and the molding material 105 have a same level upper surface. The example of FIG. 12 corresponds to an over-grinding scenario, where the planarization process removes upper portions of the die connectors 57 having curved sidewalls 57C (see FIG. 11), and the remaining portions of the die connectors 57 illustrated in FIG. 12 has straight sidewalls 57S. In other embodiments, the planarization process is controlled to stop after the die connectors 57 are exposed, and as a result, the remaining portions of the die connectors 57 in FIG. 12 still have curved sidewalls (not illustrated) connected to its upper surface 57U, in addition to the straight sidewalls 57S.

In some embodiments, the upper surface of the deposited dielectric layer 63 (see FIG. 9) may be level with or slightly lower (e.g., lower by about 3 μm to about 8 μm) than the upper surface of the die connectors 57, and as a result, the cured dielectric layer 63 in FIG. 12 may have an upper surface 63U' (illustrated in dashed lines) that is non-flat, as illustrated in FIG. 12, in which case the thinning process may be omitted. The shape and the size of the upper surface 63U' are exaggerated in FIG. 12 for illustration purpose. Various embodiments of the upper surface 63U' and its relative location with respect to the die connector 57 are discussed in detail hereinafter with reference to FIGS. 14A, 14B, 15A, 15B, 16A, and 16B.

Figure 13:
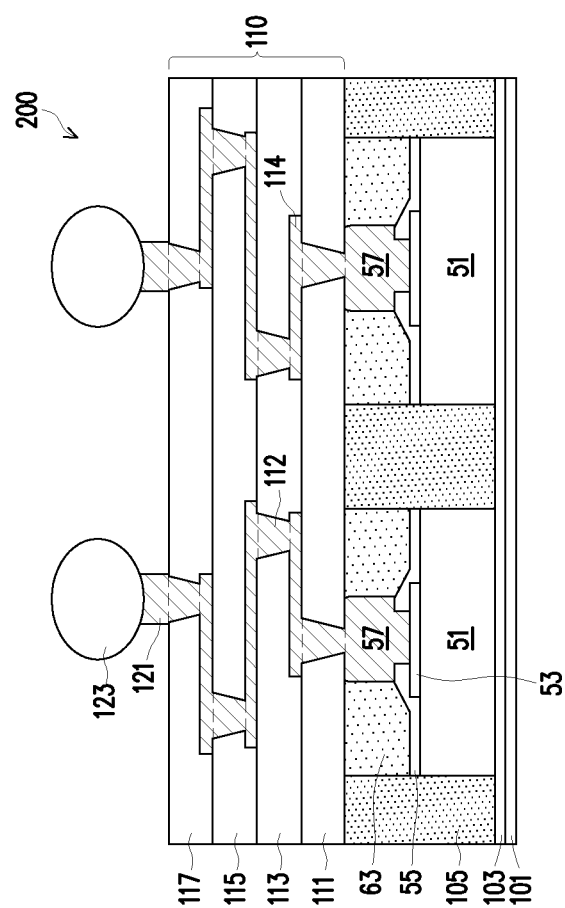

Next, in FIG. 13, the redistribution structure 110, the UBM structures 121 and the external connectors 123 are formed successively over the molding material 105 and over the dies 50 to form the structure shown in FIG. 13. Additional processing, such as attaching to a dicing tape, carrier de-bonding, and a dicing process may be performed to form a plurality of individual semiconductor devices 200. Details are not repeated here.

Figure 14A:
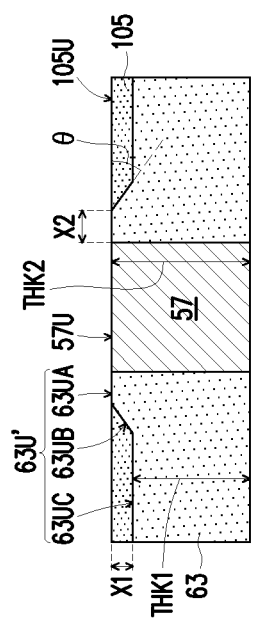
FIGS. 14A and 14B illustrate a cross-sectional view and a top view, respectively, of the semiconductor device of FIG. 12, in accordance with an embodiment.
Figure 14B:
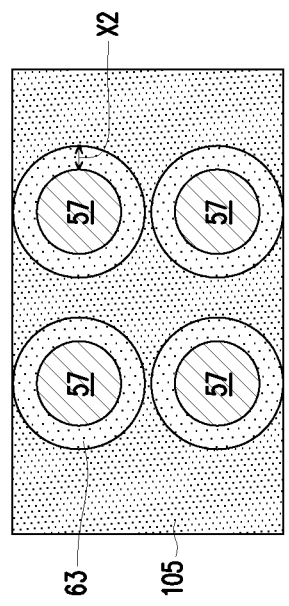

FIGS. 14A and 14B illustrate a cross-sectional view and a top view, respectively, of an area 141 of the semiconductor device 200 of FIG. 12, in accordance with an embodiment. In FIG. 14A, the non-flat (e.g., curved) upper surface 63U' of the dielectric layer 63 comprises a first portion 63UA, a second portion 63UB, and a third portion 63UC. The first portion 63UA contacts (e.g., physically contacts) and surrounds the die connector 57. Due to the planarization process (see FIG. 12 and discussion thereof), the first portion 63UA is flat (e.g., level) and is level with the upper surface 57U of the die connector 57 and is level with the upper surface 105U of the molding material 105.

Still referring to FIG. 14A, the third portion 63UC is lower (e.g., closer to the substrate 51) than the first portion 63UA. The third portion 63UC may be a flat surface that is parallel with the first portion 63UA. The second portion 63UB connects the first portion 63UA and the third portion 63UC, and is a curved surface (e.g., portion of a concave surface), as illustrated in FIG. 14A.

In some embodiments, a thickness THK1 of the dielectric layer 63, measured between the third portion 63UC of the upper surface 63U' and the lower surface of the dielectric layer 63, is between about 20 μm and about 25 μm, and a height THK2 of the die connectors 57 is between about 23 μm and about 36 μm, such as about 25 μm. In the illustrated embodiment, the third portion 63UC is lower than the first portion 63UA by a distance $X_1$, which is between about 3 μm and about 9 μm. A width $X_2$ of the first portion 63UA is between about 3 μm and about 6 μm. An angle θ, measured between a first line along the upper surface 105U and a second line along the second portion 63UB, is between about 200 and about 40°.

Figure 15A:
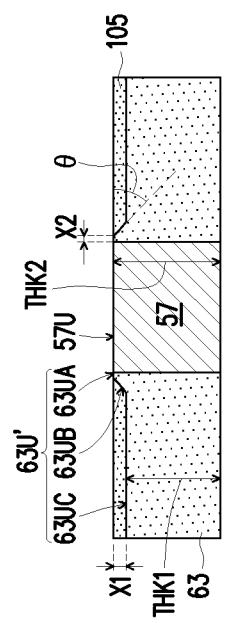
FIGS. 15A and 15B illustrate a cross-sectional view and a top view, respectively, of the semiconductor device of FIG. 12, in accordance with an embodiment.
Figure 15B:
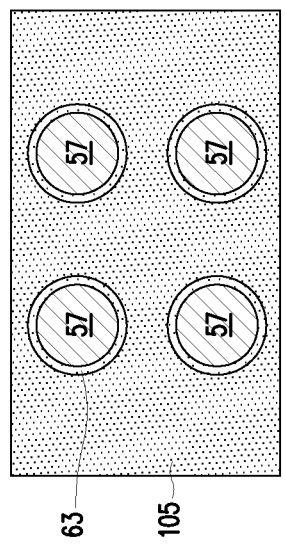

FIGS. 15A and 15B illustrate a cross-sectional view and a top view, respectively, of the area 141 of the semiconductor device 200 of FIG. 12, in accordance with another embodiment. In the example of FIGS. 15A and 15B, the first portion 63UA of the upper surface 63U' is narrower than that of FIGS. 14A and 14B, with the width $X_2$ between about 0.1 μm and about 1 μm. The distance $X_1$ between the first portion 63UA and the third portion 63UC is between about 13 μm and about 15 μm, and the angle θ is between about 400 and about 50°. The thickness THK1 of the dielectric layer 63 is between about 15 μm and about 20 μm, and the height of the die connector 57 is between about 23 μm and about 36 μm, such as about 25 μm, in the illustrated embodiment.

Figure 16A:
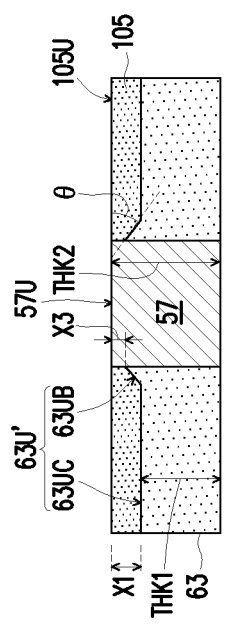
FIGS. 16A and 16B illustrate a cross-sectional view and a top view, respectively, of the semiconductor device of FIG. 12, in accordance with an embodiment.
Figure 16B:
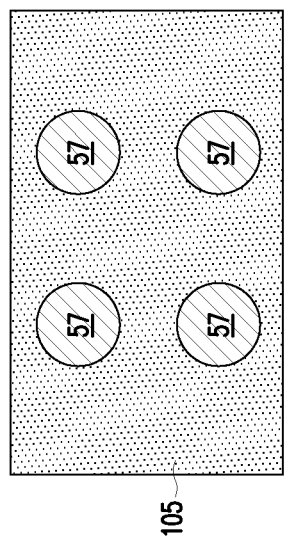

FIGS. 16A and 16B illustrate a cross-sectional view and a top view, respectively, of the area 141 of the semiconductor device 200 of FIG. 12, in accordance with yet another embodiment. In the example of FIGS. 16A and 16B, the upper surface 63U' recesses below the upper surface 57U of the die connector 57 by a distance $X_3$, which is between about 1 μm and about 2 μm. As a result, the first portion 63UA in FIGS. 14A and 15A is not present in the embodiment of FIG. 16A, and the upper surface 63U' of FIG. 16A only include the second portions 63UB and the third portions 63UC. Accordingly, in the top view of FIG. 16B, the dielectric layer 63 is not visible. Referring back to FIG. 16A, the third portion 63UC is recessed from the upper surface 57U by the distance $X_1$, which is between about 18 μm and about 21 μm. The angle θ in FIG. 16A is between about 500 and about 60°. The thickness THK1 of the dielectric layer 63 is smaller than about 15 μm, and the height of the die connector 57 is between about 23 μm and about 36 μm, such as about 25 μm, in the illustrated embodiment.

Figure 17:
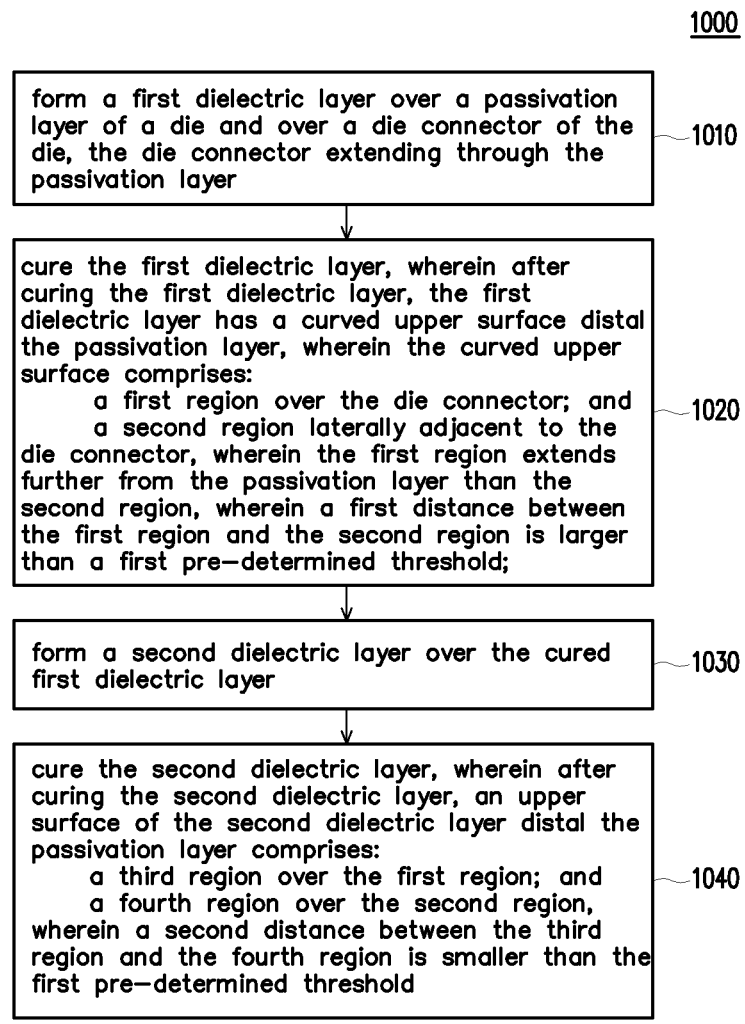
FIG. 17 illustrates a flow chart of a method of forming a semiconductor device, in some embodiments.

FIG. 17 illustrate a flow chart of a method 1000 of forming a semiconductor device, in some embodiments. It should be understood that the embodiment method shown in FIG. 17 is merely an example of many possible embodiment methods. One of ordinary skill in the art would recognize many variations, alternatives, and modifications. For example, various steps as illustrated in FIG. 17 may be added, removed, replaced, rearranged and repeated Referring to FIG. 17, at block 1010, a first dielectric layer is formed over a passivation layer of a die and over a die connector of the die, the die connector extending through the passivation layer. At block 1020, the first dielectric layer is cured, wherein after curing the first dielectric layer, the first dielectric layer has a curved upper surface distal to the passivation layer, wherein the curved upper surface comprises: a first region over the die connector; and a second region laterally adjacent to the die connector, wherein the first region extends further from the passivation layer than the second region, wherein a first distance between the first region and the second region is larger than a first pre-determined threshold. At block 1030, a second dielectric layer is formed over the cured first dielectric layer. At block 1040, the second dielectric layer is cured, wherein after curing the second dielectric layer, an upper surface of the second dielectric layer distal to the passivation layer comprises: a third region over the first region; and a fourth region over the second region, wherein a second distance between the third region and the fourth region is smaller than the first pre-determined threshold.

Embodiments may achieve advantage. By forming the dielectric layer 63 with smaller shrinkage ratio, the TTV of the dies 50 are reduced such that dies 50 with substantially uniform thicknesses are formed after a backside thinning process. The substantially uniform die thickness in turn allows for the die connectors 57 to be exposed at the same time during a subsequent planarization process used to recess the molding material 105. Without the presently disclosed methods, the die connectors 57 of thinner dies (e.g., die with smaller thickness) may still be covered by a dielectric material after the planarization process, which results in those die connectors 57 not being electrically coupled to the redistribution structure 110. The presently disclosed methods, by reducing the TTV of the dies 50, prevent or reduce device failure due to the die connectors 57 not being electrically coupled to the redistribution structure 110, thereby increasing production yield. In addition, the presently disclosed methods do not use the backside grinding (BG) tape in the backside thinning process, which reduces production cost.

In an embodiment, a method of forming a semiconductor device includes forming a first dielectric layer over a passivation layer of a die and over a die connector of the die, the die connector extending through the passivation layer, and curing the first dielectric layer, where after curing the first dielectric layer, the first dielectric layer has a curved upper surface distal to the passivation layer. The curved upper surface includes a first region over the die connector, and a second region laterally adjacent to the die connector, where the first region extends further from the passivation layer than the second region, where a first distance between the first region and the second region is larger than a first pre-determined threshold. The method further includes forming a second dielectric layer over the cured first dielectric layer, and curing the second dielectric layer, where after curing the second dielectric layer, an upper surface of the second dielectric layer distal to the passivation layer includes a third region over the first region, and a fourth region over the second region, where a second distance between the third region and the fourth region is smaller than the first pre-determined threshold. In an embodiment, before curing the second dielectric layer, the die is in a substrate, where the method further includes performing a dicing process after curing the second dielectric layer, where the dicing process separates the die from other dies in the substrate. In an embodiment, the method further includes: performing a thinning process to reduce a thickness of the die after curing the second dielectric layer; attaching the die with reduced thickness to a carrier; forming a molding material over the carrier and over the die; and forming a redistribution structure over the molding material, the redistribution structure being electrically coupled to the die. In an embodiment, the method further includes performing a planarization process after forming the molding material, where the planarization process removes at least portions of the molding material and exposes the die connector, where after the planarization process, the die connector, the first dielectric layer, and the second dielectric layer have a same level upper surface. In an embodiment, the planarization process removes portions of the first dielectric layer and portions of the second dielectric layer, where after the planarization process, remaining portions of the first dielectric layer physically contact the die connector, and remaining portions of the second dielectric layer are separated from the die connector by the remaining portions of the first dielectric layer. In an embodiment, the method further includes performing a planarization process after forming the molding material, where the planarization process removes the second dielectric layer and portions of the first dielectric layer, where after the planarization process, the die connector and the first dielectric layer have a same level upper surface. In an embodiment, the planarization process further removes upper portions of the die connector. In an embodiment, the first pre-determined threshold is 4 µm. In an embodiment, the first dielectric layer is formed of a material comprising PI, PBO, or polyacrylate, and the second dielectric layer is formed of a material comprising epoxy or phenolic epoxy. In an embodiment, the first dielectric layer has a first shrinkage ratio between about 50% and about 80%, and the second dielectric layer has a second shrinkage ratio less than about 5%. In an embodiment, the first dielectric layer is cured at a first temperature, and the second dielectric layer is cured at a second temperature lower than the first temperature. In an embodiment, the first dielectric layer and the second dielectric layer are cured at a same temperature.

In an embodiment, a method of forming a semiconductor device includes forming a first dielectric layer over a front side of a wafer, the wafer having a plurality of dies at the front side of the wafer, the first dielectric layer having a first shrinkage ratio smaller than a first pre-determined threshold; curing the first dielectric layer at a first temperature, where after curing the first dielectric layer, a first distance between a highest point of an upper surface of the first dielectric layer and a lowest point of the upper surface of the first dielectric layer is smaller than a second pre-determined threshold; thinning the wafer from a backside of the wafer; and performing a dicing process to separate the plurality of dies into individual dies. In an embodiment, the first pre-determined threshold is 1%, and the second pre-determined threshold is 4 µm. In an embodiment, the method further includes forming a second dielectric layer over the front side of the wafer before forming the first dielectric layer, the second dielectric layer having a second shrinkage ratio larger than the first pre-determined threshold; and curing the second dielectric layer after forming the second dielectric layer and before forming the first dielectric layer, where after curing the second dielectric layer, a second distance between a highest point of an upper surface of the second dielectric layer and a lowest point of the upper surface of the second dielectric layer is larger than the second pre-determined threshold. In an embodiment, curing the first dielectric layer is performed at first temperature, and where curing the second dielectric layer is performed at a second temperature higher than the first temperature.

In an embodiment, a semiconductor device includes a die having a die connector and a passivation layer, the die connector extending through the passivation layer; a first dielectric layer over the passivation layer, the first dielectric layer having a first portion in physical contact with the die connector and having a second portion spaced apart from the die connector, an upper surface of the first portion of the first dielectric layer extending further from the passivation layer than an upper surface of the second portion of the first dielectric layer; and a second dielectric layer over the upper surface of the second portion of the first dielectric layer, where the die connector, the second dielectric layer, and the first portion of the first dielectric layer have a same upper surface that is level. In an embodiment, the first dielectric layer has a first shrinkage ratio that is larger than a second shrinkage ratio of the second dielectric layer. In an embodiment, the first shrinkage ratio is between about 50% and about 80%, and the second shrinkage ratio is less than about 1%. In an embodiment, the semiconductor device further includes a molding material around the die, around the first dielectric layer and around the second dielectric layer, an upper surface of the molding material being level with the upper surface of the second dielectric layer; and a redistribution structure over the molding material and being electrically coupled to the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a die having a die connector and a passivation layer, wherein the die connector extends through the passivation layer;
a first dielectric layer over the passivation layer and around the die connector, wherein the first dielectric layer extends along sidewalls of the die connector, wherein the first dielectric layer has a first portion in contact with the die connector and has a second portion spaced apart from the die connector, wherein an upper surface of the first portion of the first dielectric layer distal from the passivation layer extends further from the passivation layer than an upper surface of the second portion of the first dielectric layer distal from the passivation layer; and
a molding material around the die and the first dielectric layer.

2. The semiconductor device of claim 1, further comprising a second dielectric layer over the upper surface of the second portion of the first dielectric layer, wherein the die connector, the second dielectric layer, and the first portion of the first dielectric layer have a coplanar upper surface.

3. The semiconductor device of claim 2, wherein the first dielectric layer has a first shrinkage ratio that is larger than a second shrinkage ratio of the second dielectric layer.

4. The semiconductor device of claim 3, wherein the first shrinkage ratio is between about 50% and about 80%, and the second shrinkage ratio is less than about 1%.

5. The semiconductor device of claim 1, wherein the upper surface of the first portion of the first dielectric layer is a flat surface, and the upper surface of the second portion of the first dielectric layer is a curved surface.

6. The semiconductor device of claim 1, wherein a shrinkage ratio of the first dielectric layer is smaller than about 1%.

7. The semiconductor device of claim 1, wherein a first portion of the molding material is disposed on the upper surface of the second portion of the first dielectric layer.

8. The semiconductor device of claim 7, wherein the first portion of the molding material, the first portion of the first dielectric layer, and the die connector have a coplanar upper surface.

9. The semiconductor device of claim 7, wherein the first portion of the molding material is further disposed on the upper surface of the first portion of the first dielectric layer, wherein the first portion of the molding material and the die connector have a coplanar upper surface.

10. The semiconductor device of claim 1, wherein the upper surface of the first portion of the first dielectric layer is level with an upper surface of the die connector distal from the passivation layer.

11. The semiconductor device of claim 1, wherein the upper surface of the first portion of the first dielectric layer is closer to the passivation layer than an upper surface of the die connector distal from the passivation layer.

12. The semiconductor device of claim 1, further comprising a redistribution structure over the molding material and electrically coupled to the die connector.

13. A semiconductor device comprising:
a die having a die connector and a passivation layer, the die connector extending through the passivation layer;
a first dielectric layer over the passivation layer, the first dielectric layer having a first portion in contact with the die connector and having a second portion laterally spaced apart from the die connector, an upper surface of the first portion of the first dielectric layer distal from the passivation layer extending further from the passivation layer than an upper surface of the second portion of the first dielectric layer distal from the passivation layer; and
a second dielectric layer over the upper surface of the second portion of the first dielectric layer, wherein the die connector, the second dielectric layer, and the first portion of the first dielectric layer have a same upper surface that is level.

14. The semiconductor device of claim 13, wherein the first dielectric layer has a first shrinkage ratio larger than a second shrinkage ratio of the second dielectric layer.

15. The semiconductor device of claim 14, wherein the first shrinkage ratio is between about 50% and about 80%, and the second shrinkage ratio is less than about 5%.

16. The semiconductor device of claim 13, further comprising:
a molding material around the die, the first dielectric layer, and the second dielectric layer; and
a redistribution structure over the molding material and electrically coupled to the die.

17. The semiconductor device of claim 13, wherein a first sidewall of the first dielectric layer, a second sidewall of the second dielectric layer, and a third sidewall of the die are vertically aligned along a same line.

18. A semiconductor device comprising:
a die having a die connector and a passivation layer at a front side of the die, wherein the die connector extends through the passivation layer;
a dielectric layer on the passivation layer around the die connector, wherein the dielectric layer has a first portion contacting the die connector and has a second portion laterally spaced apart from the die connector, wherein a first upper surface of the first portion of the dielectric layer distal from the passivation layer extends further from the passivation layer than a second upper surface of the second portion of the dielectric layer distal from the passivation layer, wherein a sidewall of the dielectric layer is aligned with a respective sidewall of the die along a same line; and a molding material around the die and the dielectric layer.

19. The semiconductor device of claim 18, wherein a portion of the molding material is disposed on the second upper surface of the second portion of the dielectric layer, wherein the first upper surface of the first portion of the dielectric layer is free of the molding material.

20. The semiconductor device of claim 18, wherein a portion of the molding material is disposed on the first upper surface and the second upper surface of the dielectric layer.

* * * * *